United States Patent [19]

Suizu

[11] Patent Number: 5,172,201
[45] Date of Patent: Dec. 15, 1992

[54] SEMICONDUCTOR MEMORY DEVICE WITH INCREASED CAPACITANCE OF CAPACITOR AND MANUFACTURING METHOD THEREOF

[75] Inventor: Katsumi Suizu, Hyogo, Japan

[73] Assignee: Mitsubishi Denki Kabushiki Kaisha, Tokyo, Japan

[21] Appl. No.: 583,983

[22] Filed: Sep. 18, 1990

[30] Foreign Application Priority Data

Sep. 19, 1989 [JP] Japan ............... 1-242995

[51] Int. Cl.$^5$ ............... H01L 29/68; H01L 29/78; H01L 29/92
[52] U.S. Cl. ............... 257/303; 257/532; 257/754
[58] Field of Search ............ 357/23.6, 23.6 G, 51, 357/59 K, 71

[56] References Cited

U.S. PATENT DOCUMENTS 4,754,313  6/1988  Takemae et al. ............ 357/23.6
4,951,175  8/1990  Kurosawa et al. ............ 437/48
4,974,040 11/1990  Taguchi et al. ............ 357/23.6

FOREIGN PATENT DOCUMENTS 61-183952  8/1986  Japan.

Primary Examiner—Andrew J. James
Assistant Examiner—Sara W. Crane
Attorney, Agent, or Firm—Lowe, Price, LeBlanc & Becker

[57] ABSTRACT

Disclosed is a stacked capacitor type semiconductor memory device having an increased capacitance of a capacitor. An upward projection member projecting upward is provided on an interlayer insulation film. A storage node is provided on the interlayer insulation film to cover the upward projection member. A capacitor insulation film is provided to cover the storage node. A cell plate electrode is provided to cover the capacitor insulation film. With such a semiconductor memory device, the storage node is formed to cover the upward projection member provided on the interlayer insulation film, thereby to increase a surface area of the storage node.

9 Claims, 12 Drawing Sheets

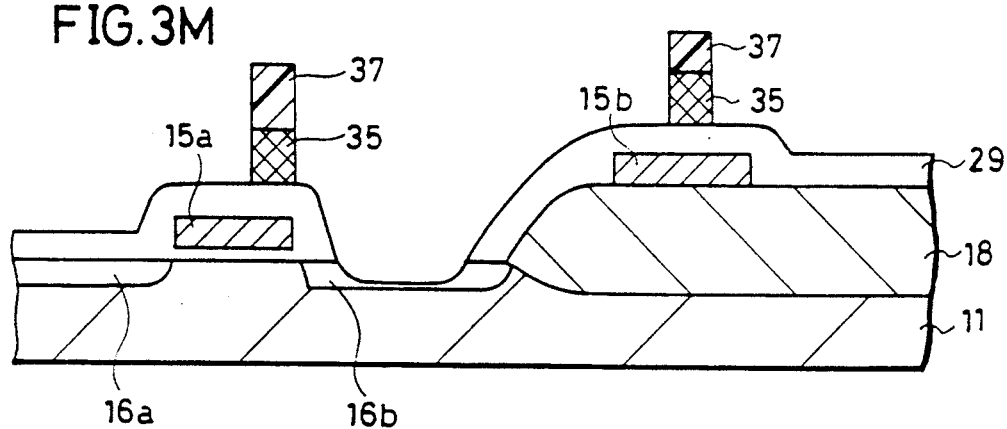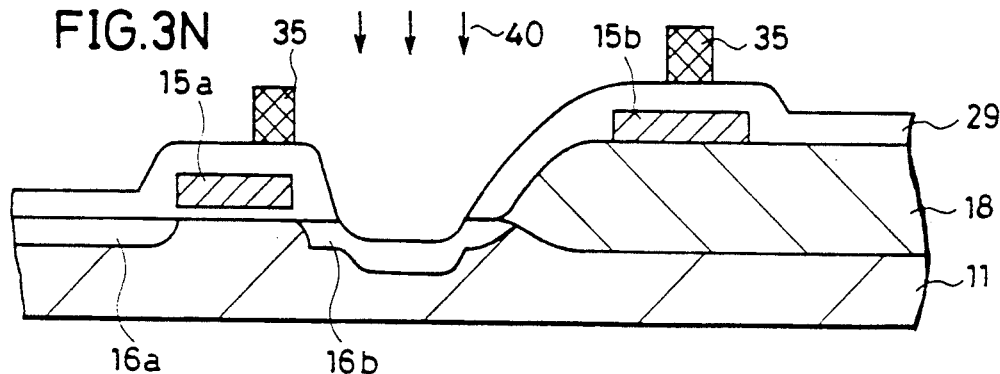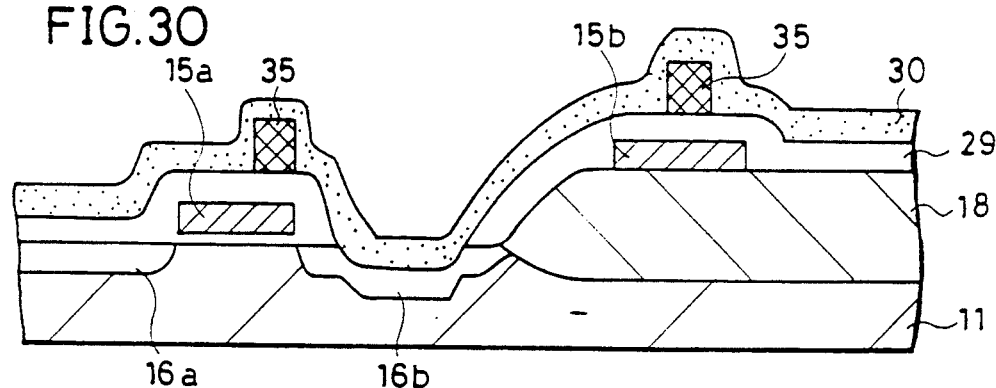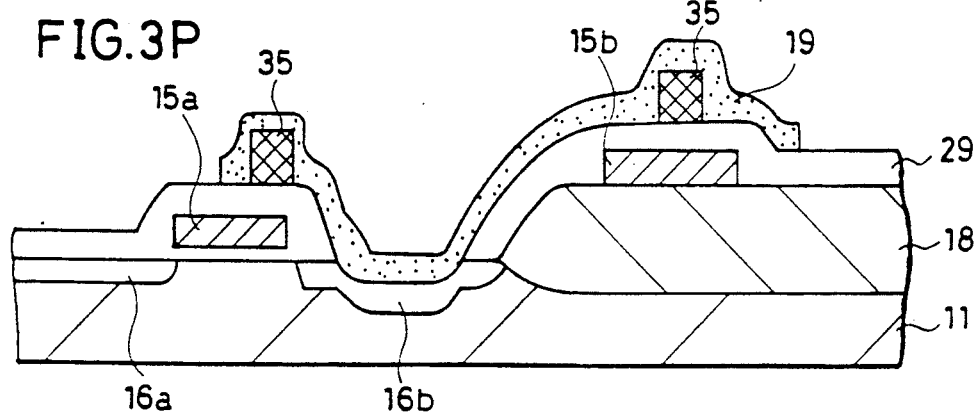

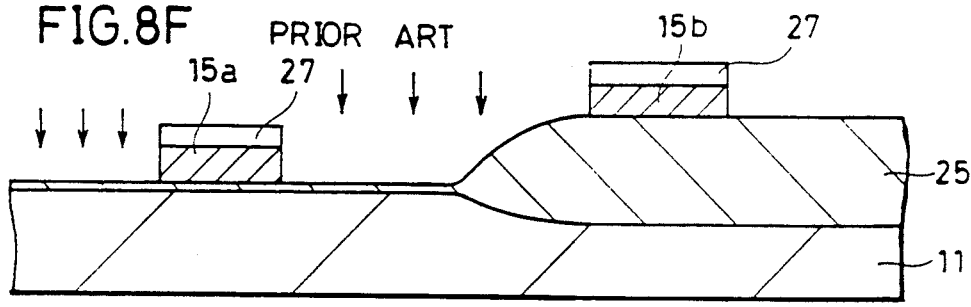
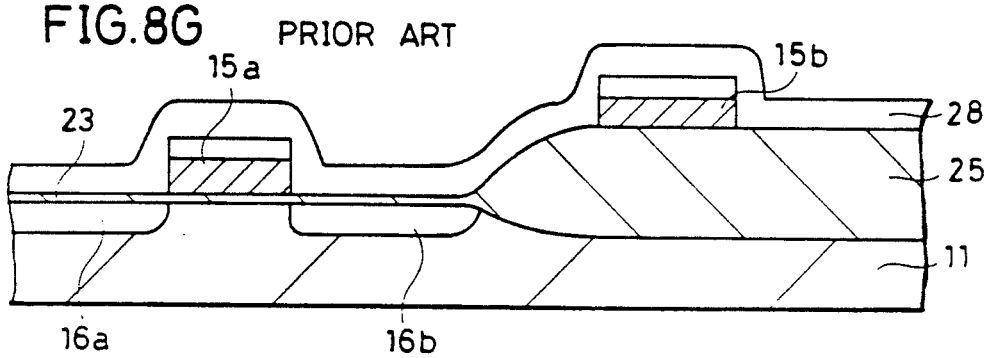
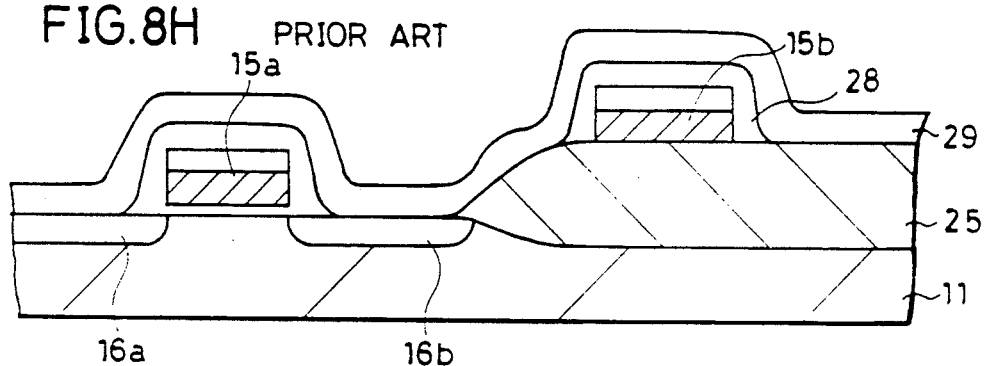
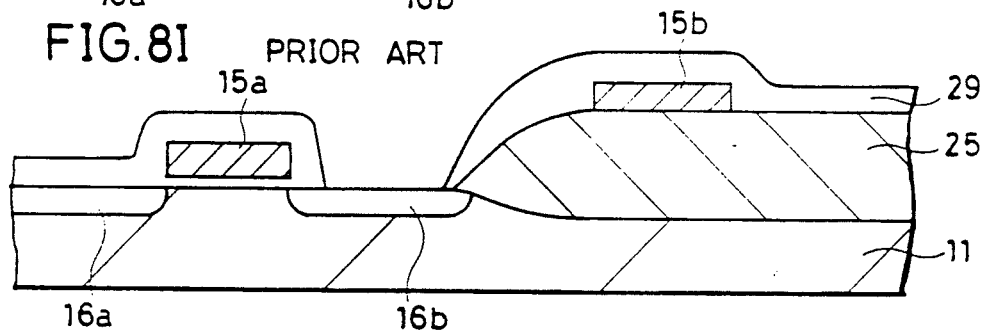
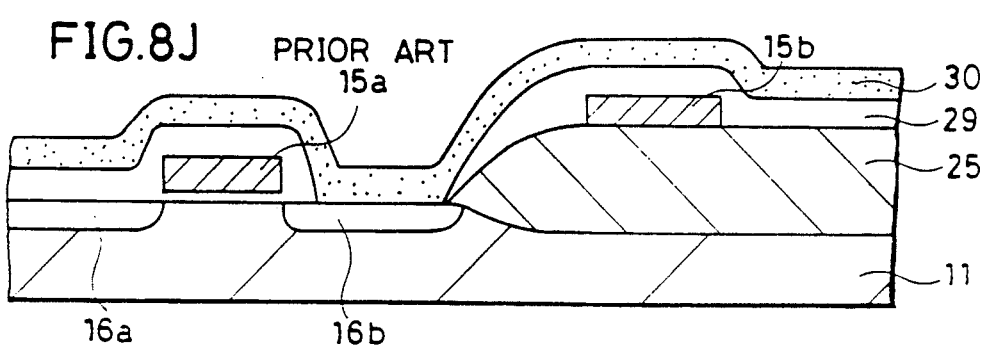

SEMICONDUCTOR MEMORY DEVICE WITH INCREASED CAPACITANCE OF CAPACITOR AND MANUFACTURING METHOD THEREOF

BACKGROUND OF THE INVENTION

1. Field of the Invention

The present invention relates generally to semiconductor memory devices and, more particularly, to an improved semiconductor memory device with an increased capacitance of a capacitor. The invention further relates to a method of manufacturing such an improved semiconductor memory device.

2. Description of the Background Art

An IC memory often comprises a memory cell array including a number of storage elements, and a peripheral circuit required for inputting and outputting, which are formed on the same substrate.

FIG. 4 is a block diagram of one example of a general configuration of a random access memory (RAM). Referring to the figure, a plurality of word lines and bit lines are provided intersecting each other on a memory cell array 1. Memory cells are each provided at the intersections of the word lines and bit lines. Each of the memory cells is selected based on the intersection between one of the word lines selected by an X address buffer decoder 2 and one of the bit lines selected by a Y address buffer decoder 3. Data is written in a selected memory cell, or data stored in the selected memory cell is read out. An instruction of this data writing/reading is carried out by a read/write control signal (R/W) to be applied from an R/W control circuit 4. In data writing, input data (Din) is inputted to the selected memory cell via the R/W control circuit 4. In data reading, after detection by a sense amplifier 5, the data stored in the selected memory cell is amplified and then outputted as output data (Dout) via a data output buffer 6.

FIG. 5 is an equivalent circuit diagram of a dynamic memory cell shown for a description of the writing/reading operation of a memory cell.

Referring to the figure, a dynamic memory cell comprises one field effect transistor 7 and a capacitor 8. A gate electrode of the field effect transistor 7 is connected to a word line 9. A source/drain region of the field effect transistor 7 connected to the capacitor 8 is connected to a bit line 10. In data writing, a predetermined potential is applied to the word line 9. This application of the predetermined potential renders the field effect transistor 7 conductive and causes a charge applied to the bit line 10 to be stored in the capacitor 8. In data reading, a predetermined potential is applied to the word line 9. This application of the predetermined potential renders the field effect transistor 7 conductive and causes the charge stored in the capacitor 8 to be taken out through the bit line 10.

FIG. 6 is a plan view of a major portion of a conventional semiconductor memory device comprising stacked capacitor memory cells, and FIG. 7 is a sectional view taken along the line VII—VII of FIG. 6.

Referring to these figures, a field effect transistor 12 and a stacked capacitor 13 are provided on a p type semiconductor substrate 11. The field effect transistor 12 is formed in an active region 22 isolated by an oxide film 18 for isolation. The field effect transistor 12 comprises a gate electrode 15a (the word line) provided on the semiconductor substrate 11 with a gate oxide film 14, and n+ impurity regions 16a, 16b (source/drain regions) provided on a major surface of the semiconductor substrate 11. The stacked capacitor 13 comprises a storage node 19 contacting the source or drain region (the n+ impurity region 16b) of the field effect transistor 12 and extending through an interlayer insulation film 17 over the gate electrode 15a of the field effect transistor 12 and over an adjacent word line 15b, a capacitor insulation film 20 provided on the storage node 19, and a cell plate electrode 21 provided on the capacitor insulation film 20.

The semiconductor memory device structured as above, renders the source/drain region (the n+ impurity regions 16a, 16b) conductive to carry out the reading/writing operation by the selection of a word line and then the application of the predetermined potential to the gate electrode 15a.

A description will be given on a method of manufacturing the conventional semiconductor memory device comprising the above described stacked capacitor. This method is disclosed, for example, in Japanese Patent Laying-Open No. 61-183952.

Referring to FIG. 8A, a silicon oxide film 23 and a silicon nitride film 24 are formed in turn on a p+ semiconductor substrate 11 (a silicon substrate).

Referring to FIG. 8B, the silicon oxide film 23 and the silicon nitride film 24 are then patterned by photolithography so as to form an opening in a portion in which an oxide film for isolation is to be formed.

As shown in FIG. 8C, an oxide film 25 for isolation is formed on a main surface of the semiconductor substrate 11 by thermal oxidation.

Then, the silicon oxide film 23 and the silicon nitride film 24 are removed, as shown in FIGS. 8C and 8D.

Referring to FIG. 8E, a gate oxide film 14 is formed in an active region. Thereafter, a polysilicon layer 26 (which may be a doped polysilicon layer) serving as a first conductor film is formed on the overall surface of the semiconductor substrate 11 by a CVD method. A SiO$_2$ film 27 serving as a first insulator film is then formed on the polysilicon layer 26.

Referring to FIGS. 8E and 8F, the polysilicon layer 26 and the SiO$_2$ film 27 are then patterned in the form of the word line. Thereby, the word lines are formed. (The gate electrode 15a and the adjacent word line 15b appear in the figure).

As shown in FIGS. 8F and 8G, when phosphorus is ion-implanted, the n type impurity regions 16a, 16b located on both sides of the gate electrode 15a are formed in a self-aligned manner in the main surface of the semiconductor substrate 11. A SiO$_2$ film 28 is then formed over the overall surface of the substrate 11 by the CVD method.

Referring to FIGS. 8G and 8H, the SiO$_2$ film 28 is etched so that portions of the SiO$_2$ film 28 remain on the upper portion and the sidewall portion of the word lines (the gate electrode 15a and the adjacent word line 15b).

Then, a SiO$_2$ film 29 serving as a second insulator film is formed on the overall surface of the semiconductor substrate 11.

Next, as shown in FIG. 8I, the SiO$_2$ film 29 is etched so as to expose the surface of the n+ impurity region 16b formed on the main surface of the substrate 11.

Next, as shown in FIG. 8J, a polysilicon layer 30 to be a storage node is deposited on the overall surface of the semiconductor substrate 11 by the CVD method so as to contact the exposed surface of the n+ impurity region 16b.

Referring to FIG. 8K, patterning of the polysilicon layer 30 in a predetermined form results in the formation of the storage node 19.

Next, as shown in FIG. 8L, a thin film of $Si_3N_4$ is formed on the entire surface of the substrate 11 including the storage node 19. Thereafter, an oxidation of this thin film of $Si_3N_4$ results in formation of an oxide film 31 of $Si_3N_4$ to be a capacitor insulation film. Then, a polysilicon film 32 (which may be a doped polysilicon film) to be a cell plate electrode is deposited on the entire surface of the substrate 11 by the CVD method.

Referring to FIGS. 8L and 8M, patterning the oxide film 31 of $Si_3N_4$ and the polysilicon film 32 in a predetermined form causes a capacitor insulation film 20 and a cell plate electrode 21 to be formed. FIG. 8M is a sectional view corresponding to FIG. 7.

Next, as shown in FIG. 8N, an interlayer insulation film 33 ($SiO_2$) is formed by the CVD method on the overall surface of the substrate 11 including the cell plate electrode 21. Thereafter, a contact hole 33a is formed in the interlayer insulation film 33 so as to expose the surface of the n+ impurity region 16a. Polysilicon to be a bit line is then deposited by the CVD method on the overall surface of the semiconductor substrate 11 so as to bury the contact hole 33a. Patterning this polysilicon in the form of the bit line results in formation of a bit line 34.

Since the conventional semiconductor memory device comprising the stacked capacitor is structured as above, cell capacitance is limited by an area of the planar storage node 19, as shown in FIGS. 6 and 7. Thus, the area of the storage node 19 becomes decreased with a higher degree of integration, and hence the capacitance of the memory cell becomes decreased. The amount of charges stored in the memory cell also decreases. Therefore, there are disadvantages of soft error (a phenomenon that a generation of a carrier by radiation causes a malfunction of the memory) and a degradation in an operation margin.

SUMMARY OF THE INVENTION

It is an object of the present invention to provide an improved stacked capacitor type semiconductor memory device capable of increasing the capacitance of a capacitor.

It is another object of the present invention to provide an improved one-transistor one-stacked capacitor type semiconductor memory device capable of increasing the capacitance of a capacitor.

It is a further object of the present invention to increase the capacitance of the capacitor by increasing a surface area of a storage node in a stacked capacitor type semiconductor memory device.

It is a still further object of the present invention to improve a further miniaturized stacked capacitor type semiconductor memory device so as not to cause soft error therein.

It is a further object of the present invention to improve a further miniaturized stacked capacitor type semiconductor memory device so as to be able to prevent a degradation in an operation margin.

It is a still further object of the present invention to improve a further miniaturized stacked capacitor type semiconductor memory device so as not to cause such disadvantages as soft error and a degradation in an operation margin, with a sufficient cell capacitance.

It is a still further object of the present invention to provide a method of manufacturing an improved stacked capacitor type semiconductor memory device capable of increasing the capacitance of a capacitor.

In order to achieve the above objects, the semiconductor memory device according to the present invention includes a semiconductor substrate having a main surface and an oxide film for isolation formed on the main surface, and a memory cell having a transistor and a capacitor. This transistor includes a pair of source/drain regions formed in the main surface of the semiconductor substrate, and a gate electrode provided on the semiconductor substrate. The capacitor is provided to cover the gate electrode and the isolation oxide film and includes an interlayer insulation film having an opening for exposing one of the source/drain regions. An upward projection member projecting upward is provided on the interlayer insulation film. A storage node is provided on the interlayer insulation film to cover the upward projection member and come into contact with one of the source/drain regions. A capacitor insulation film is provided to cover the storage node. A cell plate electrode is provided to cover the capacitor insulation film.

A manufacturing method according to another aspect of the present invention is directed to a method of manufacturing a semiconductor memory device including a transistor having a gate electrode and a pair of source/drain regions, and a capacitor having a storage node, a capacitor insulation film and a cell plate electrode. A word line including the gate electrode is formed on a semiconductor substrate. The pair of source/drain regions are formed in the surface of the semiconductor substrate. An interlayer insulation film is formed on the semiconductor substrate to cover the word line. An opening is formed in the interlayer insulation film for exposing one of the source/drain regions. An upward projection member projecting upward is formed on the interlayer insulation film. The storage node is formed to cover the upward projection member and come into contact with one of the source/drain regions. The capacitor insulation film is formed to cover the storage node. The cell plate electrode is formed on the capacitor insulation film.

The semiconductor memory device according to the present invention includes the upward projection member provided on the interlayer insulation film and the storage node covering the upward projection member, thereby forming the surface of the storage node in the form of concave and convex, resulting in an increased surface area of the storage node and consequently an increased capacitance of the capacitor.

In accordance with the manufacturing method of the semiconductor memory device according to another aspect of the present invention, the storage node is formed to cover the upward projection member provided on the interlayer insulation film, thereby forming the surface of the storage node in the form of concave and convex, resulting in an increased surface area of the storage node and thus an increased capacitance of the capacitor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiment of the present invention will now be described with reference to the figures.

Figure 1:
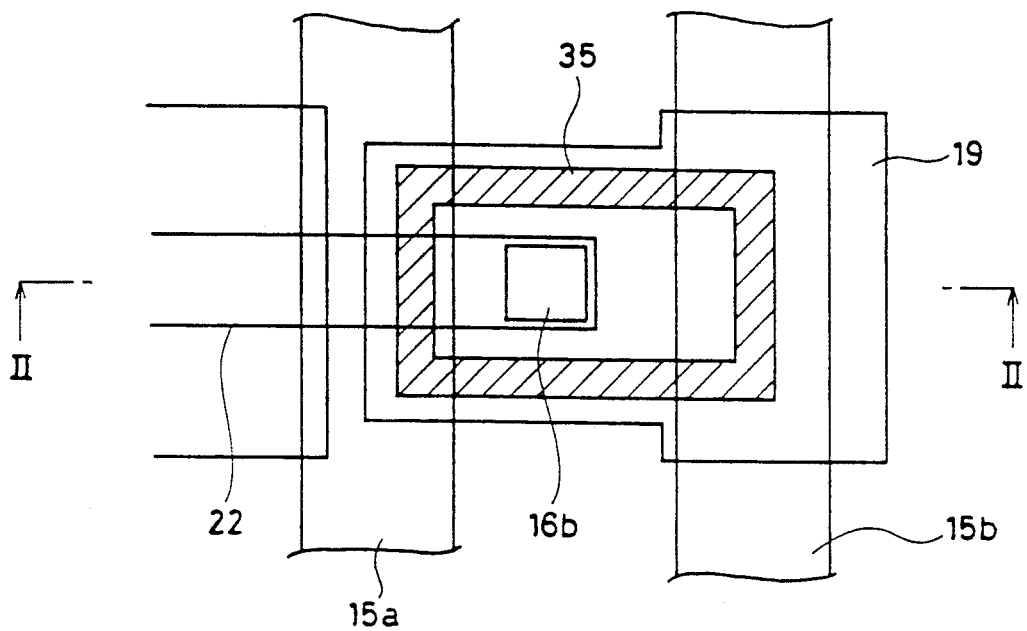
FIG. 1 is a plan view of a major portion of a semiconductor memory device comprising a stacked capacitor, according to one embodiment of the present invention.
Figure 2:
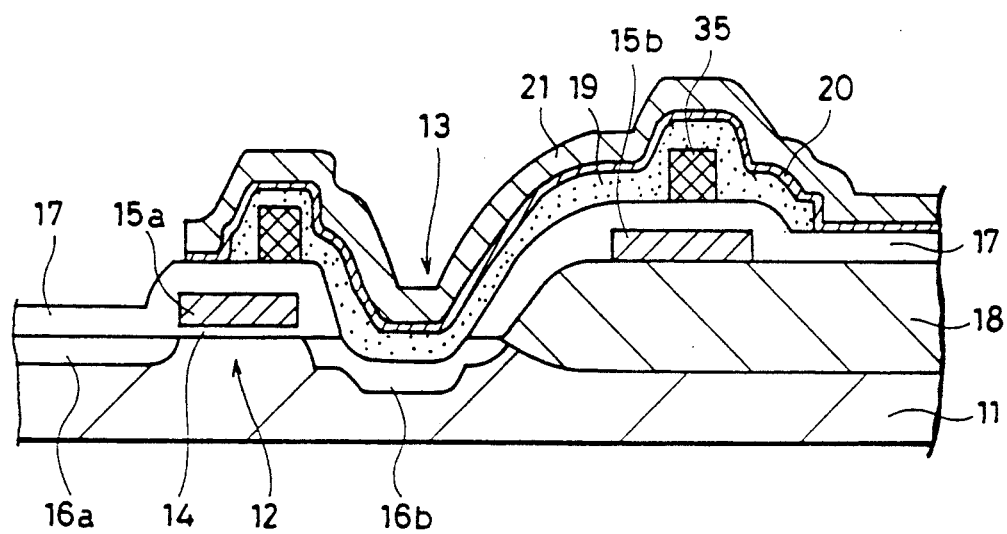
FIG. 2 is a sectional view taken along the line II—II of FIG. 1.

Referring to FIGS. 1 and 2, a field effect transistor 12 and a stacked capacitor 13 are provided on a p type semiconductor substrate 11. The field effect transistor 12 is formed in an active region 22 isolated by an oxide film 18 for isolation. The field effect transistor 12 comprises a gate electrode (a word line) 15a provided on the substrate 11, with a gate oxide film 14 therebetween, and n+ impurity regions 16a, 16b (source/drain regions) provided in a major surface of the substrate 11. The stacked capacitor 13 comprises a storage node 19, contacting the source or drain region (the n+ impurity region 16b) of the field effect transistor 12 and extending over the gate electrode 15a of the field effect transistor 12 and over an adjacent word line 15b with an interlayer insulation film 17 therebetween, a capacitor insulation film 20 provided on the storage node 19, and a cell plate electrode 21 provided on the capacitor insulation film 20. An upward projection member 35, projecting upward, is provided on the interlayer insulation film 17. The storage node 19 covers this upward projection member 35. Thus, convex and concave portions are formed on the surface of the storage node 19, and a surface area thereof is increased. The upward projection member 35 is ring-shaped. This ring-shaped upward projection member 35 extends over the interlayer insulation film 17 on the gate electrode 15a of the field effect transistor 12 and on the adjacent word line 15b.

A portion of the storage node 19, contacting the source or drain region (the n+ impurity region 16b) of the field effect transistor is buried in the semiconductor substrate 11. This buried portion of the storage node 19 renders the surface area thereof still larger.

In the semiconductor memory device according to this embodiment, the surface area of the storage node 19 is made larger as described above, so that the capacitance of the capacitor is increased. This results in an increased amount of a charge stored therein. Therefore, an application of this embodiment to a more miniaturized stacked capacitor type semiconductor memory device achieves such an effect that an occurrence of a soft error is inhibited, and further enables prevention of a deterioration in an operating margin.

While the aforementioned embodiment exemplifies the upward projection member 35 in the form of ring, this invention is not limited to this, and any form of the upward projection member 35 may be employed as far as the surface area of the storage node 19 can be made larger.

A description will now be given on a method of manufacturing the semiconductor memory device comprising the stacked capacitor, according to one embodiment of the present invention, shown in FIGS. 1 and 2.

Figure 3A:
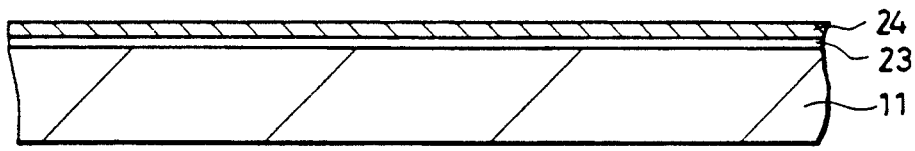
FIGS. 3A–3S are sectional views showing the steps of manufacturing the stacked capacitor type semiconductor memory device shown in FIG. 2.
Figure 3B:
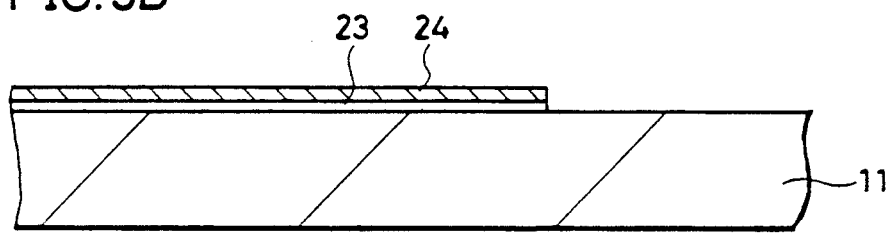
Figure 3C:
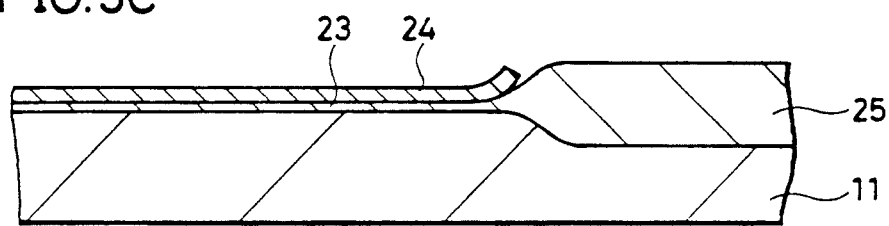
Figure 3D:
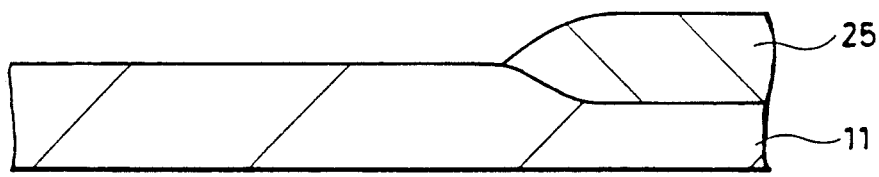
Figure 3E:
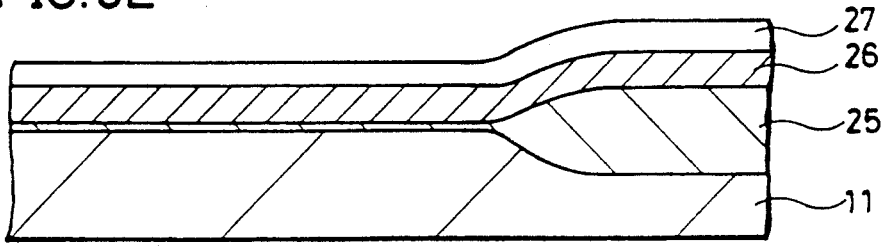
Figure 3F:
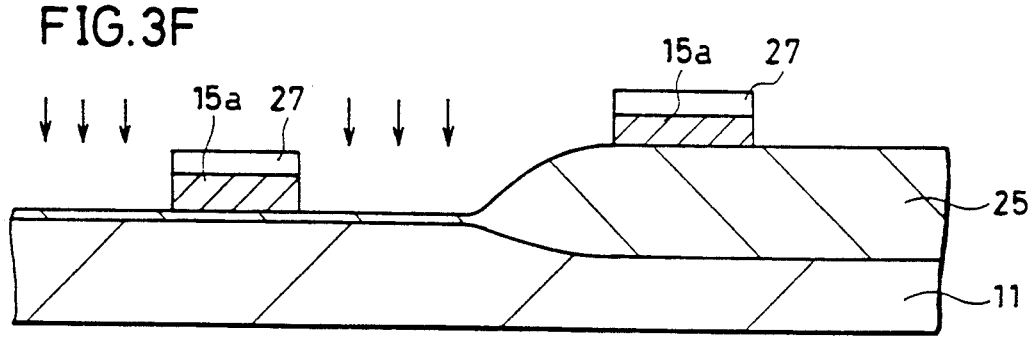
Figure 3G:
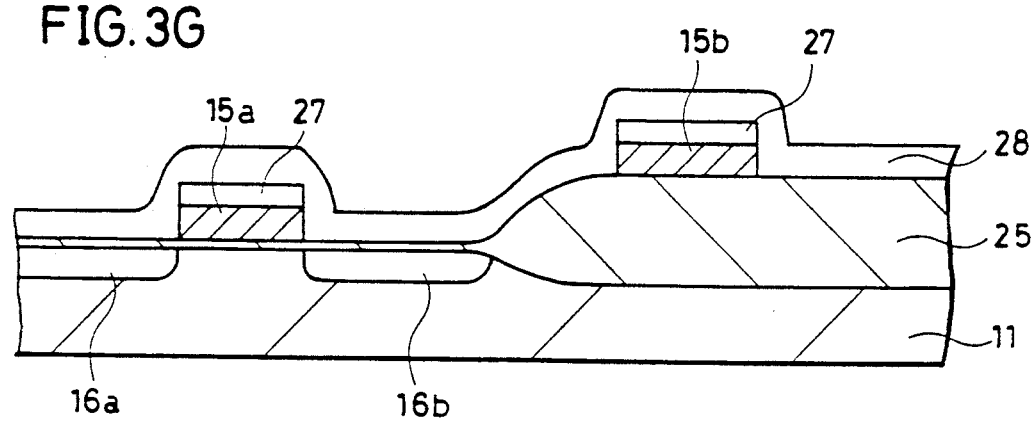
Figure 3H:
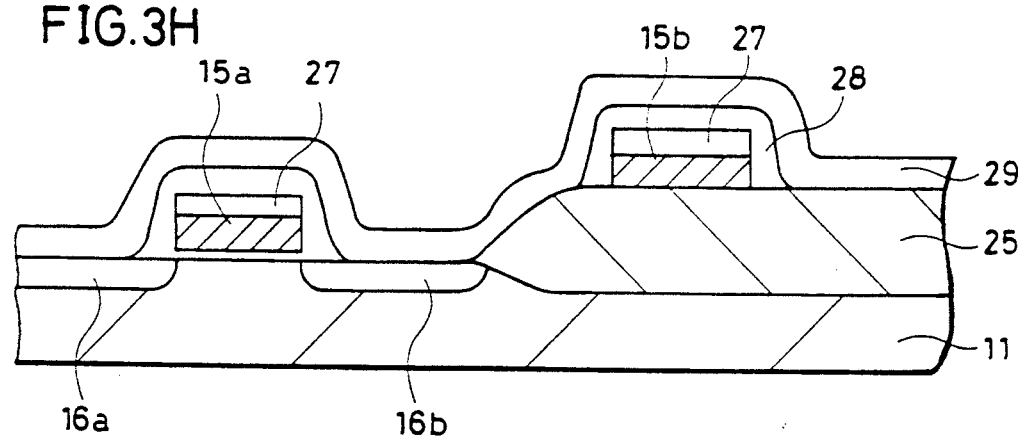
Figure 3I:
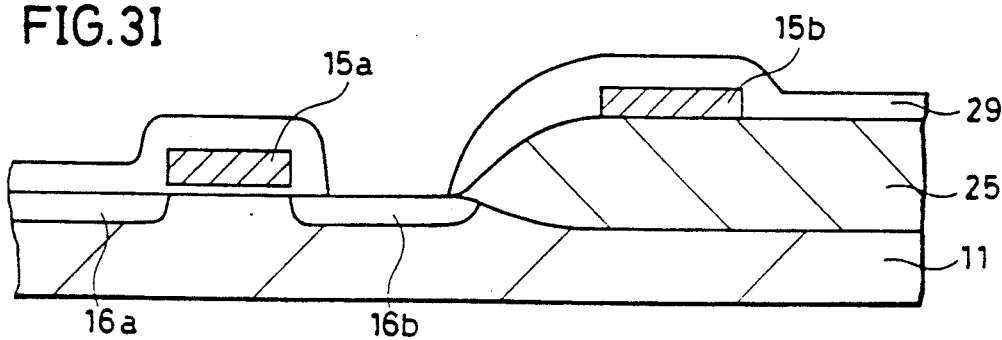
Figure 3J:
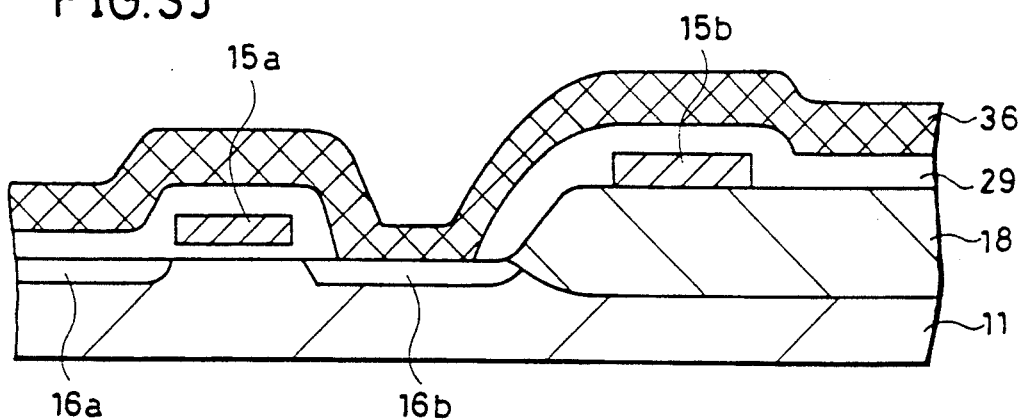
Figure 3K:
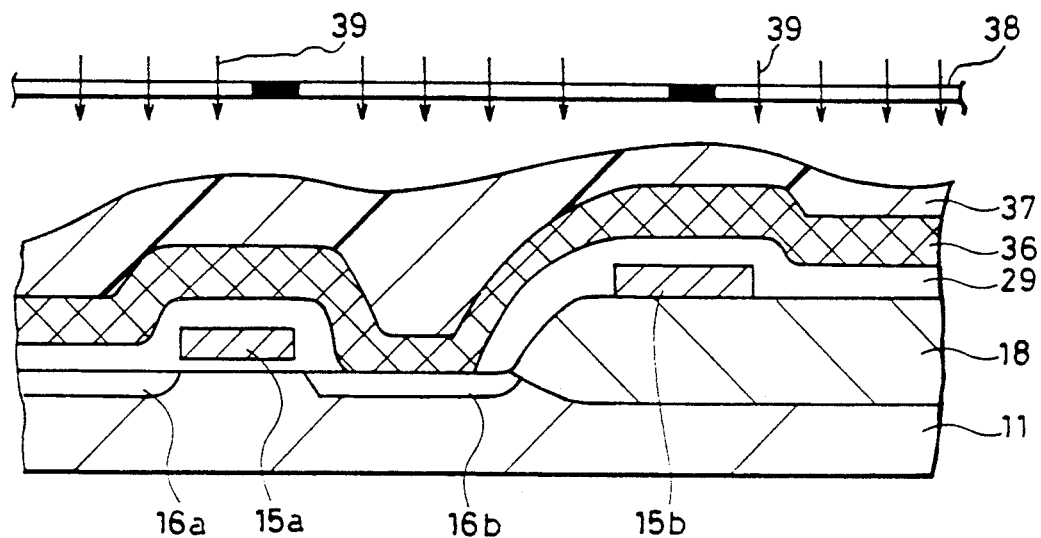
Figure 3L:
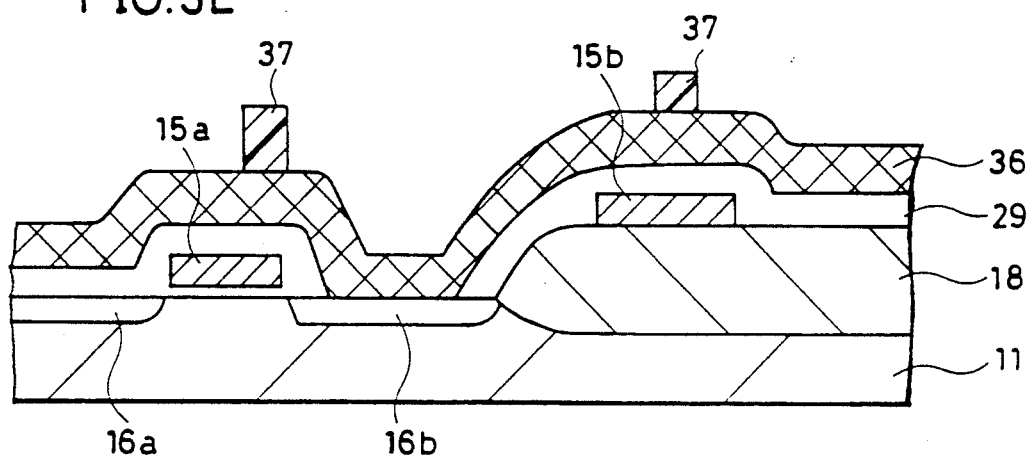
Figure 3Q:
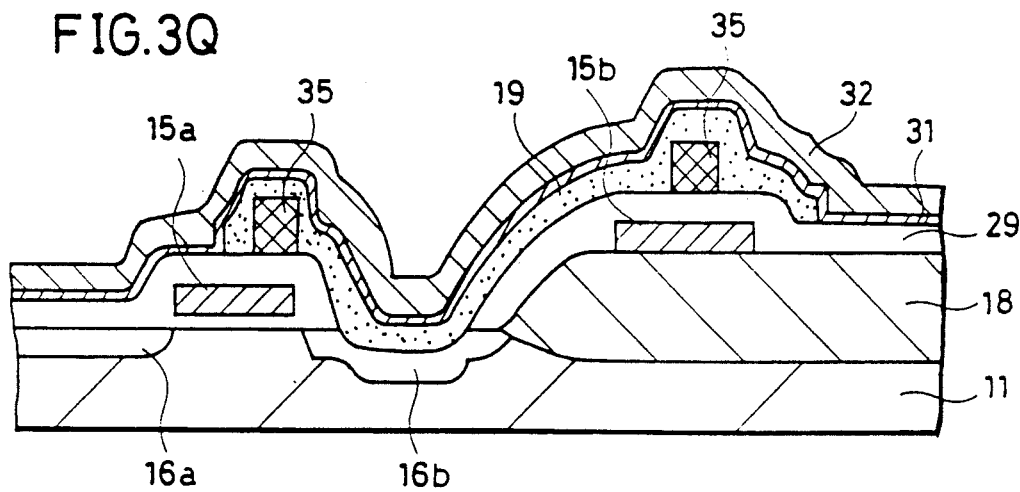
Figure 3R:
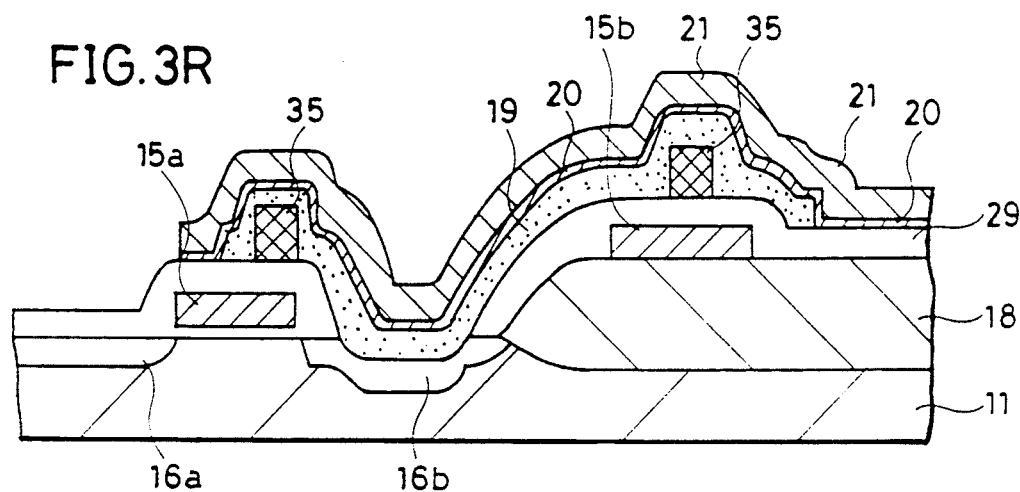
Figure 3S:
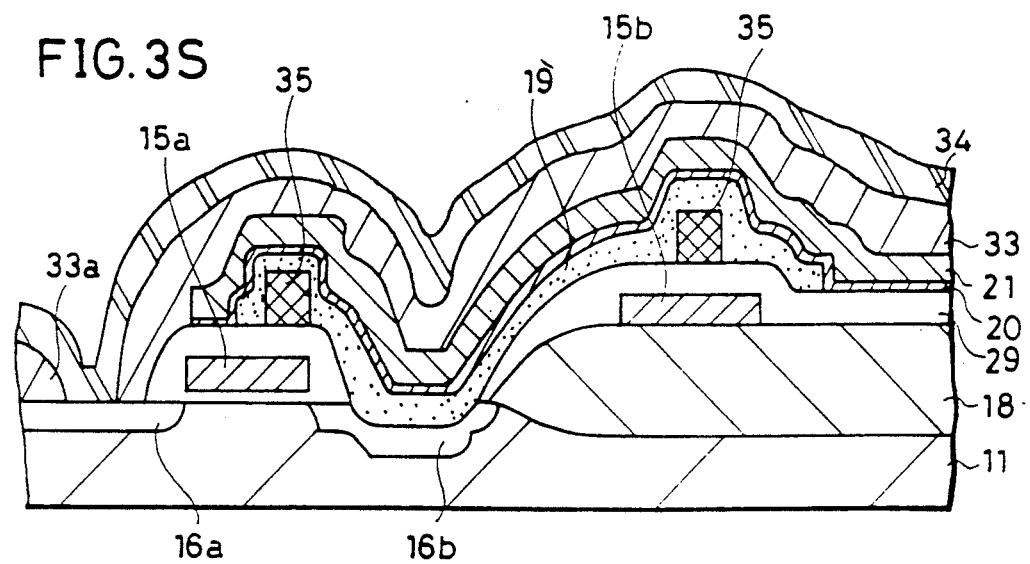
Figure 4:
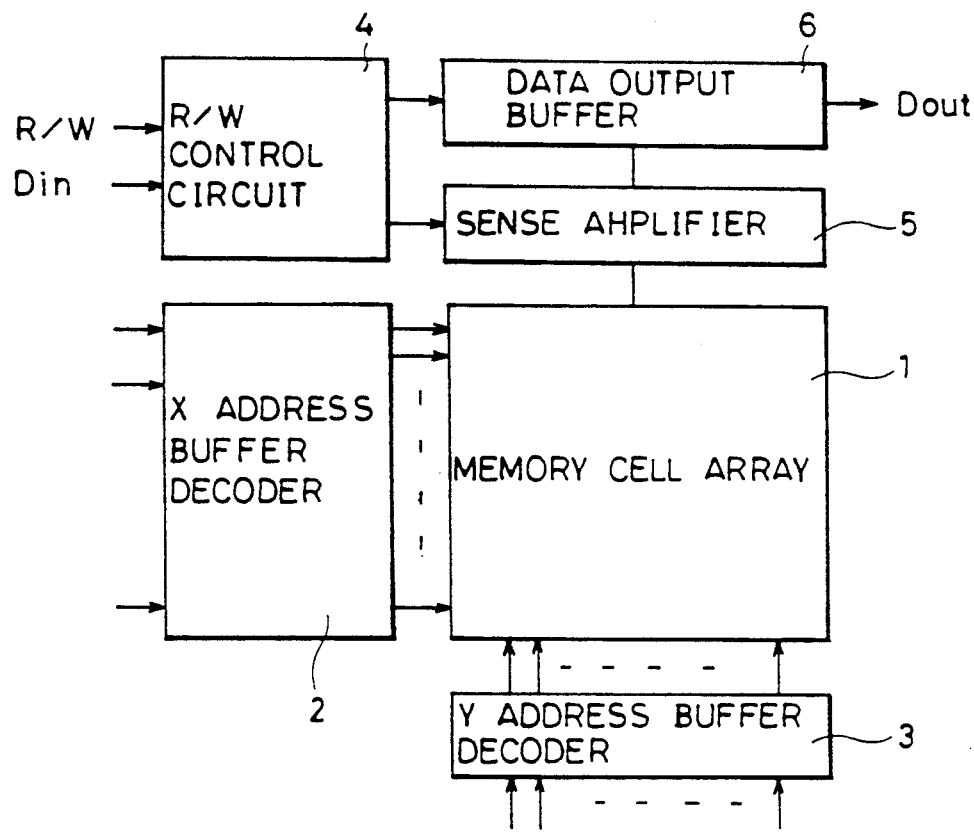
FIG. 4 is a block diagram of one example of the configuration of a general RAM.
Figure 5:
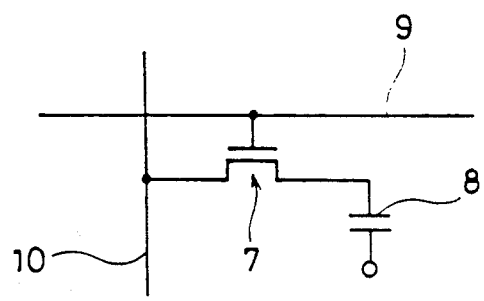
FIG. 5 is an equivalent circuit diagram of a dynamic memory cell shown to describe writing/reading operations of a memory cell.
Figure 6:
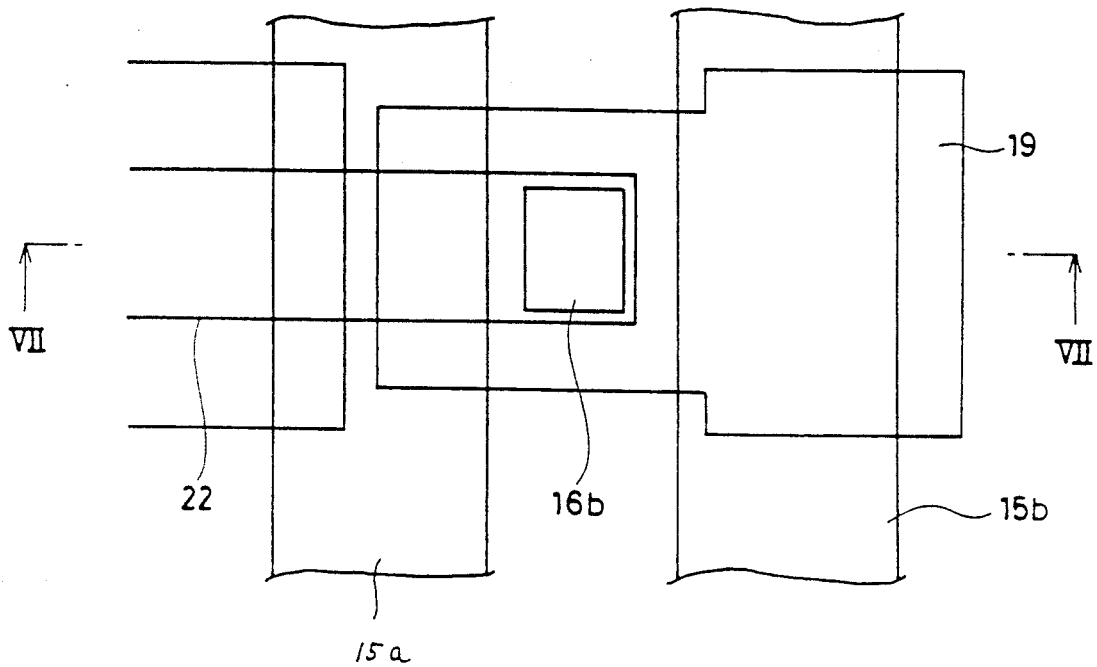
FIG. 6 is a plan view of a major portion of a conventional semiconductor memory device comprising a stacked capacitor.
Figure 7:
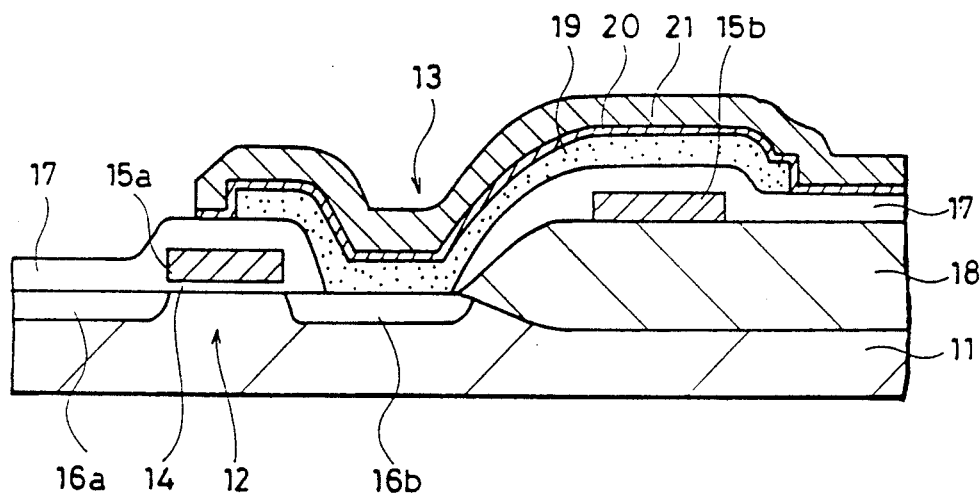
FIG. 7 is a sectional view taken along the line VII—VII of FIG. 6.
Figure 8A:
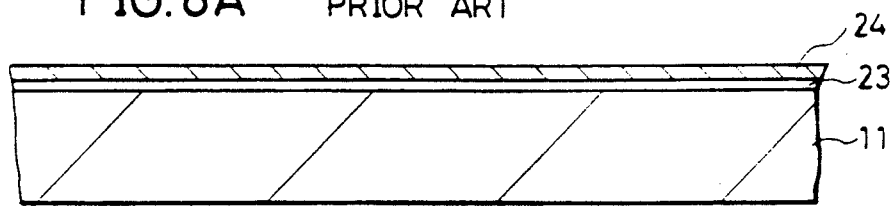
FIGS. 8A–8N are sectional views showing the steps of manufacturing the conventional semiconductor memory device comprising the stacked capacitor.
Figure 8B:
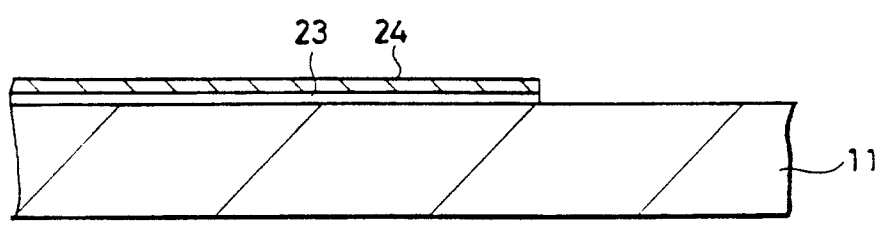
Figure 8C:
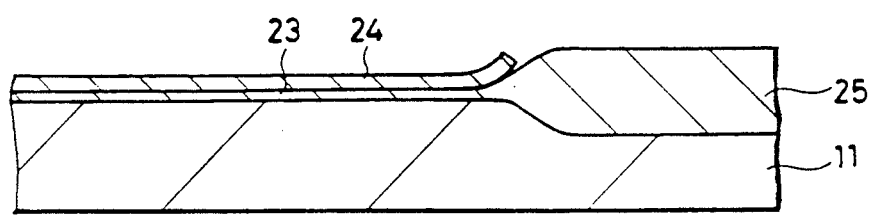
Figure 8D:
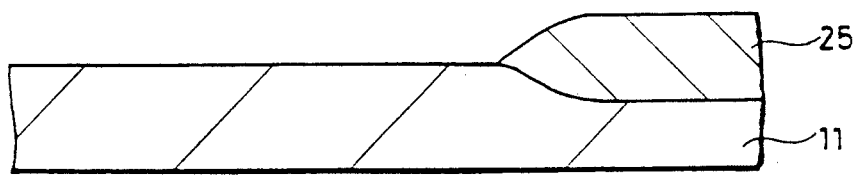
Figure 8E:
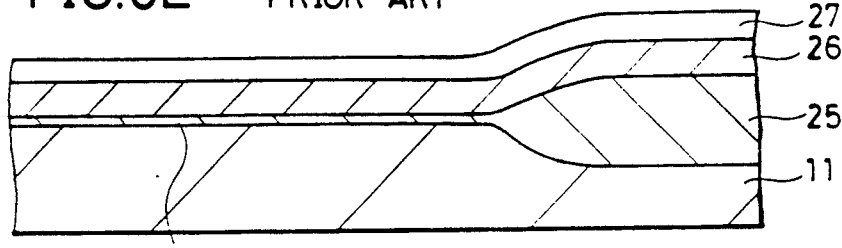
Figure 8K:
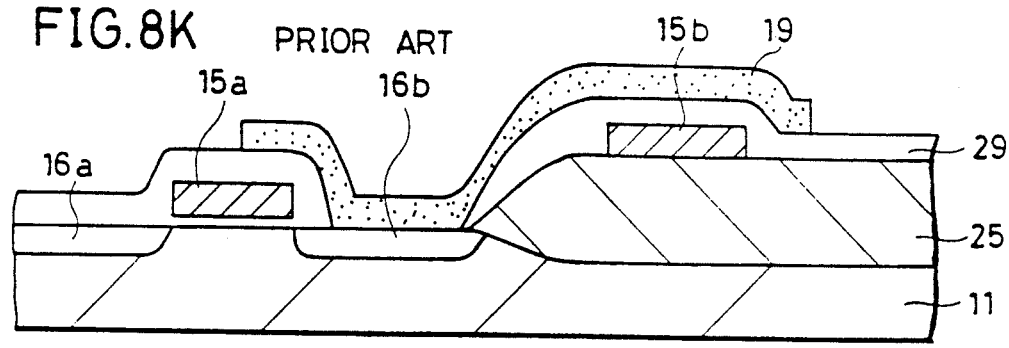
Figure 8L:
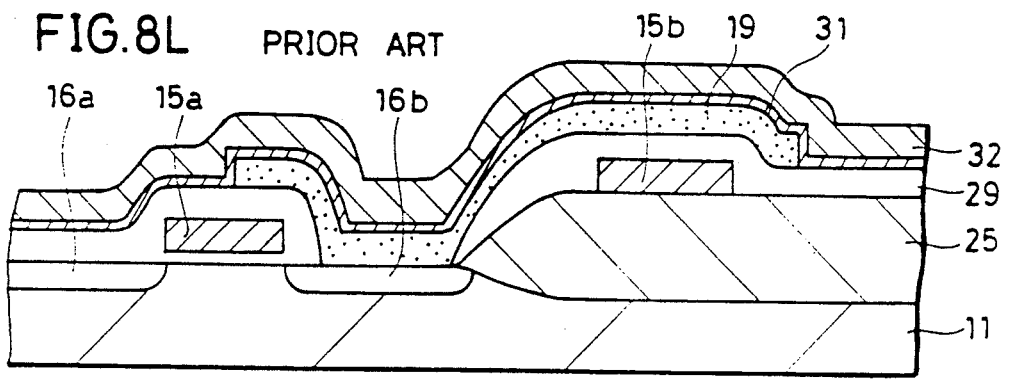
Figure 8M:
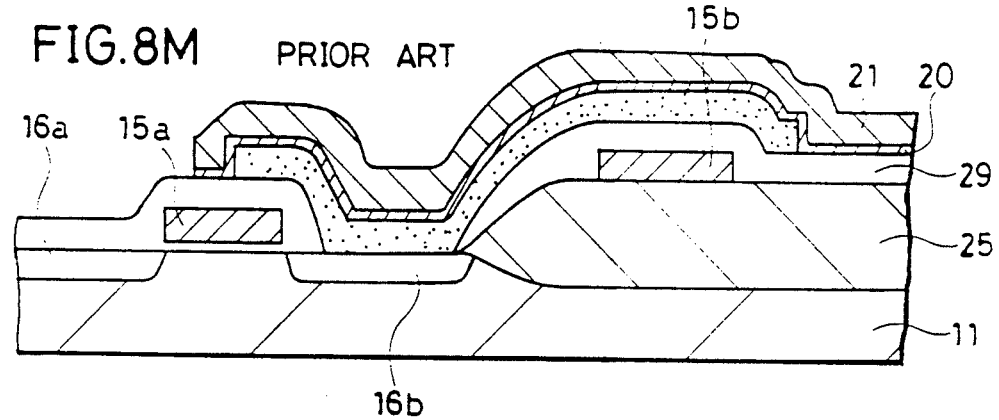
Figure 8N:
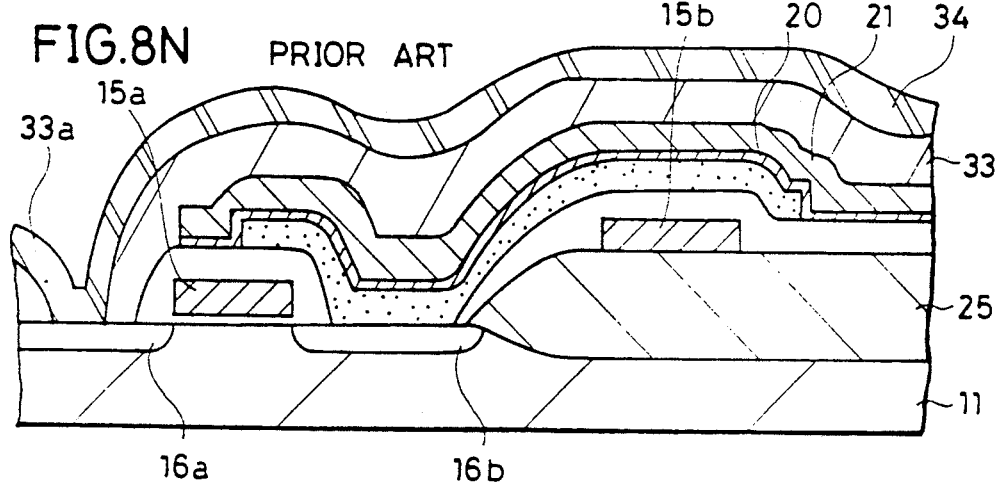

FIGS. 3A–3S are section views showing the steps of manufacturing the semiconductor memory device comprising the stacked capacitor, shown in FIGS. 1 and 2.

Since the steps shown in the FIGS. 3A–3I are the same as the conventional steps shown in FIGS. 8A–8I, the identical or corresponding portions in FIGS. 3A–3I to those in FIGS. 8A–8I are denoted with like reference numerals, and thus the description will not be repeated.

Referring to FIG. 3J, a material layer 36 to be a precursor for forming convex and concave portions on the surface of the storage node is formed on the overall surface of the semiconductor substrate 11 so as to cover the etched $SiO_2$ film 29 (the second insulator film) and contact the exposed surface of the source or drain region (the n+ impurity region 16b). The material layer 36 is formed employing polysilicon by the CVD method.

A photoresist 37 is then formed on the material layer 36, with reference to FIG. 3K. Thereafter, light 39 is directed to the photoresist 37 by employing a mask 38.

Next, a portion of the photoresist 37 becomes annular and remains on the material layer 36 by developing, as shown in FIG. 3L.

Referring to FIG. 3M, an ECR (Electron Cyclotron Resonance) etching (ECR/RIE etching) is carried out employing the photoresist 37 as a mask under condition shown in Table I below. The etching is carried out in two steps.

TABLE I

|  | Step 1 | Step 2 |
|---|---|---|
| RF power (W) | 100 | 40 |
| Microwave (mA) | 170 | 170 |
| Ratio of gas $SF_6$/ Flon 113 (SCCF) | 1/10 | 1/1 |
| Pressure (mTorr) | 10 | 10 |
| Ratio of selecting $SiO_2$ | 4~4.5 | 20~25 |

The condition shown in the Table I is one example of preferable conditions, and hence it can appropriately be varied if necessary.

Under the above etching condition, a portion of the material layer 36 remains in the form of a ring, as the upper projection member 35, on the interlayer insulation film 29, with reference to FIGS. 3L and 3M. At the same time, the surface of the source or drain region (the n+ impurity region 16b) of the field effect transistor 12 in the substrate 11 is excavated.

Referring to FIGS. 3M and 3N, the photoresist 37 is removed, and n type impurity ions 40 such as phosphorus are implanted to the surface of the substrate 11. This ion implantation replenishes the n+ impurity region 16b with the n type impurity ions.

Next, as shown in FIG. 3O, a polysilicon layer 30 serving as the second conductor film is deposited on the overall surface of the substrate 11 by the CVD method so as to cover the upper projection member 35 and fill the excavated portion of the n+ impurity region 16b in the substrate 11.

Patterning the polysilicon layer 30 in a predetermined shape then results in a formation of the storage node 19, as shown in FIG. 3P.

Next, a thin film of $Si_3N_4$ is formed on the entire surface of the substrate 11 including the storage node 19, with reference to FIG. 3Q. Thereafter, oxidation of this thin film of $Si_3N_4$ allows formation of an oxide film 31 of $Si_3N_4$ to be a capacitor insulation film. A polysilicon film 32 (which may comprise doped polysilicon) serving as a third conductor film to be a cell plate electrode is then deposited on the overall surface of the substrate 11 by the CVD method.

Referring to FIGS. 3Q and 3R, patterning the oxide film 31 of $Si_3N_4$ and the polysilicon film 32 in a predetermined shape results in formation of a capacitor insulation film 20 and a cell plate electrode 21. FIG. 3R is a cross sectional view corresponding to FIG. 2.

As shown in FIG. 3S, an interlayer insulation film 33 ($SiO_2$) is then deposited on the entire surface of the substrate 11 including the cell plate electrode 21 by the CVD method. Thereafter, a contact hole 33a is formed in the interlayer insulation film 33 to expose the surface of the n+ impurity region 16a. Polysilicon to be a bit line is deposited on the whole surface of the substrate 11 by the CVD method so as to fill the contact hole 33, and a tungsten silicide layer is subsequently deposited by sputtering. Patterning the deposited polysilicon and the tungsten silicide layer in the form of the bit line results in formation of a bit line 34.

In accordance with this embodiment, as shown in FIG. 3M, the surface area of the storage node can be increased only by adding the step of forming the annular upper projection member 35 to the conventional manufacturing steps.

While the annular upper projection member 35 is exemplified in the above described embodiment, the upper projection member 35 of various shapes can be formed by varying the pattern shape of the photomask 38, with reference to FIG. 3K.

Figure 9:
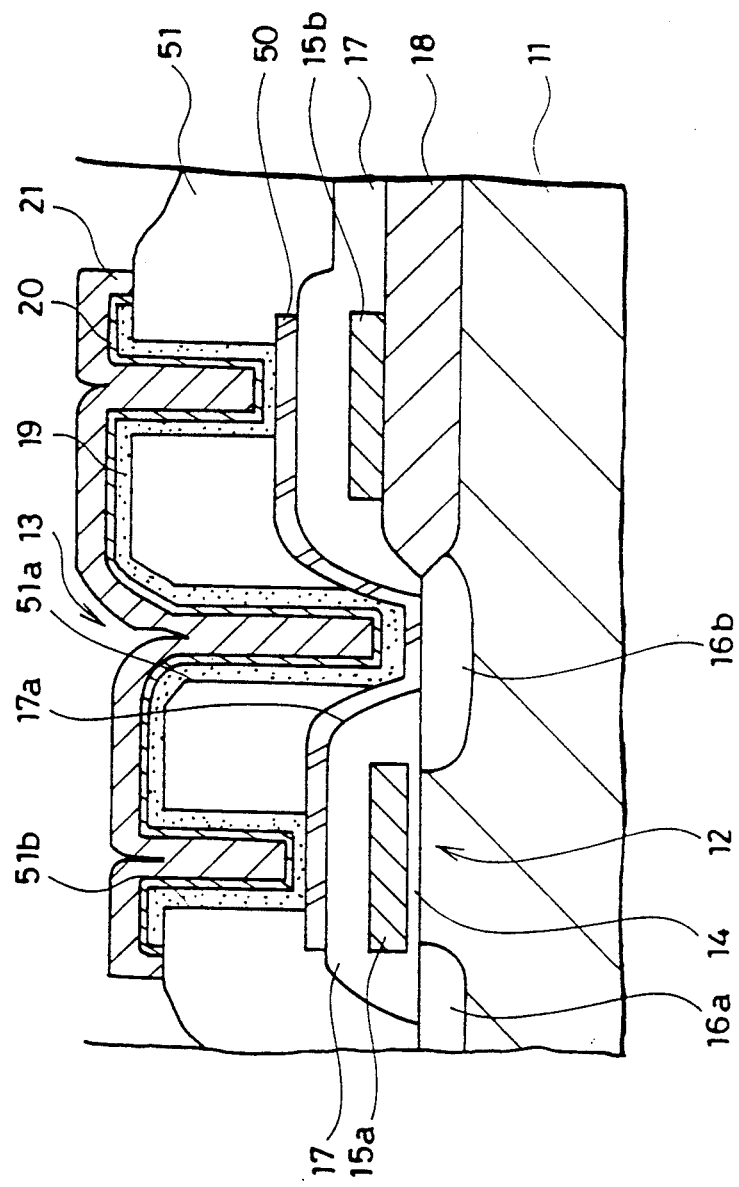
FIG. 9 is a sectional view of a semiconductor memory device according to another embodiment of the present invention.

FIG. 9 is a sectional view of a semiconductor memory device according to another embodiment of the present invention.

Referring to FIG. 9, a field effect transistor 12 and a stacked capacitor 13 are provided on a p type semiconductor substrate 11. The field effect transistor 12 is formed in an active region isolated by an oxide film 18 for isolation. The field effect transistor 12 comprises a gate electrode (a word line) 15a formed on a gate oxide film 14 and n+ impurity regions 16a, 16b (source or drain regions) provided in a main surface of the semiconductor substrate 11.

An interlayer insulation film 17 is formed to cover the gate electrode 15a and an adjacent word line 15b. An opening 17a is provided in the interlayer insulation film 17 for exposing the n+ impurity region 16b. A polysilicon layer 50 is provided on the interlayer insulation film 17, portion of which is in contact with the n+ impurity region 16b. An oxide film 51 is provided on the polysilicon layer 50. This oxide film 51 is formed relatively thick. An opening 51a for exposing portion of the polysilicon layer 50 is provided in the oxide film 51 and is located above the n+ impurity region 16b. A concave portion 51b is also provided in the oxide film 51 and located above the gate electrode 15a. A storage node 19 is formed along the sidewall surface and bottom surface of the opening 51a and concave portion 51b. This causes the surface of the storage node 19 to be formed in the form of concave and convex and thus to have an increased surface area thereof. A capacitor insulation film 20 is formed to cover the storage node 19. A cell plate electrode 21 is formed to cover the capacitor insulation film 20. Also in this embodiment, the surface area of the storage node 19 is increased, thereby to increase the capacitance of the capacitor.

As has been described, the semiconductor memory device according to the present invention includes the upward projection member projecting upward on the interlayer insulation film and the storage node covering the upward projection member, thereby forming the surface of the storage node in the form of concave and convex and hence increasing the surface area of the storage node. Consequently, such an effect is obtained that the memory capacitance of the capacitor in the semiconductor memory device is increased.

In accordance with the manufacturing method of the semiconductor memory device according to another aspect of the present invention, since the storage node is formed to cover the upward projection member provided on the interlayer insulation film, the surface of the storage node is formed in the form of concave and convex. This results in an increased surface area of the storage node and thus the increased capacitance of the capacitor in the semiconductor memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a semiconductor substrate having a main surface and an oxide film for isolation formed on the main surface; and
   a memory cell having a transistor and a capacitor,
   said transistor including a pair of source/drain regions formed in the main surface of said semiconductor substrate and a gate electrode provided on said semiconductor substrate,
   said capacitor including
   an interlayer insulation film provided to cover said gate electrode and said isolation oxide film and having an opening for exposing one of said source/drain regions,
   a conductor layer formed to be in contact with a bottom surface of said opening and to cover said interlayer insulation film,
   an oxide film provided on said conductor layer and having an opening above and said gate electrode for exposing a portion of said conductor layer,
   said oxide film having at least one concave portion,
   a storage node,
   said concave portion of said oxide film being concave with respect to said storage node,
   said storage node formed along a sidewall surface and a bottom surface of the opening and the concave portion of said oxide film,
   a capacitor insulation film provided to cover said storage node, and a cell plate electrode provided to cover said capacitor insulation film.

2. A semiconductor memory device comprising:

a semiconductor substrate having a main surface and an oxide film for isolation formed on the main surface;

a memory cell having a transistor and a capacitor, said transistor including a pair of source/drain regions formed in the main surface of said semiconductor substrate and a gate electrode provided on said semiconductor substrate, said capacitor including a first interlayer insulation film provided to cover said gate electrode and said isolation oxide film and having a first opening for exposing one of said source/drain regions, a polysilicon layer provided on the first interlayer insulation film so as to contact one of said source/drain regions through the first opening, a second interlayer insulation film provided on the semiconductor substrate so as to cover the polysilicon layer, said second interlayer insulation film having a second opening overlying said gate electrode, said second opening exposing a portion of the polysilicon layer, a storage node provided on the second interlayer insulation film so as to cover an inner wall surface of the second opening and contact the portion of the polysilicon layer, a capacitor insulation film provided to cover said storage node, and a cell plate electrode provided to cover said capacitor insulation film.

3. A semiconductor memory device comprising:

a semiconductor substrate having a main surface and an isolation oxide film formed on the main surface;

a memory cell having a transistor and a capacitor, said transistor including a pair of source/drain regions formed in the main surface of said semiconductor substrate and a gate electrode provided on said semiconductor substrate, said capacitor including a first interlayer insulation film covering said gate electrode and said isolation oxide film and having an opening for exposing one of said source/drain regions, a polysilicon layer provided on the first interlayer insulation film so as to contact one of said source/drain regions through said opening, a second interlayer insulation film provided on said semiconductor substrate and covering the polysilicon layer, said second interlayer insulation film having at least one notch exposing a portion of the polysilicon layer above said gate electrode, said at least one notch being substantially perpendicular to the main surface of said semiconductor substrate and including inner wall surfaces, a storage node provided on the second interlayer insulation film covering said inner wall surfaces of said at least one notch and contacting the exposed portion of the polysilicon layer, a capacitor insulation film covering said storage node, and a cell plate electrode covering said capacitor insulation film.

4. A semiconductor memory device as recited in claim 3, wherein said second interlayer insulation film includes a second notch exposing a portion of the polysilicon layer located over said opening in said first interlayer insulation film and over at least one of said source/drain regions and said storage node contacts said exposed portion of the polysilicon layer over said at least one of said source/drain regions.

5. A semiconductor memory device as recited in claim 4, wherein said storage node contacts said exposed portion of the polysilicon layer over both said at least one of said source/drain regions and over said gate electrode.

6. A semiconductor memory device as recited in claim 5 further comprising an adjacent gate electrode disposed over said isolation oxide film, said adjacent gate electrode forming an adjacent word line, wherein said second interlayer insulation film comprises at least a third notch exposing a portion of the polysilicon layer, said third notch located over said adjacent gate electrode, and wherein said storage node also contacts said exposed portion of the polysilicon layer over said adjacent gate electrode.

7. A semiconductor memory device as recited in claim 3, wherein said storage node contacts said exposed portion of the polysilicon layer over said gate electrode.

8. A semiconductor memory device as recited in claim 7 further comprising an adjacent gate electrode disposed over said isolation oxide film, said adjacent gate electrode forming an adjacent word line, wherein said second interlayer insulation film comprises at least a second notch exposing a portion of the polysilicon layer, said second notch located over said adjacent gate electrode, and wherein said storage node also contacts said exposed portion of the polysilicon layer over said adjacent gate electrode.

9. A semiconductor memory device as recited in claim 3 further comprising an adjacent gate electrode disposed over said isolation oxide film, said adjacent gate electrode forming an adjacent word line, wherein said second interlayer insulation film comprises at least a second notch exposing a portion of the polysilicon layer, said second notch located over said adjacent gate electrode, and wherein said storage node also contacts said exposed portion of the polysilicon layer over said adjacent gate electrode.

* * * * *